(12) United States Patent
Hong et al.

(10) Patent No.: US 12,274,178 B2
(45) Date of Patent: Apr. 8, 2025

(54) LOGIC ELEMENT USING SPIN-ORBIT TORQUE AND MAGNETIC TUNNEL JUNCTION STRUCTURE

(71) Applicant: IUCF-HYU (INDUSTRY-UNIVERSITY COOPERATION FOUNDATION HANYANG UNIVERSITY), Seoul (KR)

(72) Inventors: Jin Pyo Hong, Seoul (KR); Jeong Hun Shin, Seoul (KR); Jeong Woo Seo, Seoul (KR)

(73) Assignee: IUCF-HYU (INDUSTRY-UNIVERSITY COOPERATION FOUNDATION HANYANG UNIVERSITY), Seoul (KR)

( * ) Notice: Subject to any disclaimer, the term of this patent is extended or adjusted under 35 U.S.C. 154(b) by 207 days.

(21) Appl. No.: 17/911,047

(22) PCT Filed: Feb. 25, 2021

(86) PCT No.: PCT/KR2021/002337
§ 371 (c)(1),
(2) Date: Sep. 12, 2022

(87) PCT Pub. No.: WO2021/182778
PCT Pub. Date: Sep. 16, 2021

(65) Prior Publication Data
US 2023/0119656 A1 Apr. 20, 2023

(30) Foreign Application Priority Data
Mar. 13, 2020 (KR) .................. 10-2020-0031196

(51) Int. Cl.
*H10N 50/10* (2023.01)
*G11C 11/16* (2006.01)
(Continued)

(52) U.S. Cl.
CPC .......... *H10N 50/10* (2023.02); *G11C 11/161* (2013.01); *G11C 11/1673* (2013.01);
(Continued)

(58) Field of Classification Search
CPC ......... H10B 61/22; H10N 50/10; G11C 11/16
(Continued)

(56) References Cited

U.S. PATENT DOCUMENTS 9,824,735 B1* 11/2017 Kan ..................... G11C 11/1695
2012/0217993 A1* 8/2012 Nikonov ................ H10B 61/00
326/35
(Continued)

FOREIGN PATENT DOCUMENTS

CN 104428256 A 3/2015
JP 2013-222952 A 10/2013
(Continued)

OTHER PUBLICATIONS

International Search Report for PCT/KR2021/002337 dated Jun. 4, 2021.

*Primary Examiner* — Muna A Techane
(74) *Attorney, Agent, or Firm* — Sughrue Mion, PLLC

(57) ABSTRACT

Disclosed is logic device using spin orbit torque. Two magnetic tunnel junctions have mutually opposite magnetization directions. The direction of the current flowing through the non-magnetic metal layer acts as an input, and the resistance states of the magnetic tunnel junctions are determined by the input program currents. Various logic
(Continued)

devices are implemented by a method of setting the input program current to a logic high or a logic low.

11 Claims, 6 Drawing Sheets

(51) Int. Cl.
    *H01F 10/32*     (2006.01)
    *H10B 61/00*     (2023.01)
    *H10N 50/80*     (2023.01)
    *H10N 50/85*     (2023.01)

(52) U.S. Cl.
    CPC ...... *G11C 11/1675* (2013.01); *H01F 10/3272* (2013.01); *H01F 10/3286* (2013.01); *H01F 10/329* (2013.01); *H10B 61/22* (2023.02); *H10N 50/80* (2023.02); *H10N 50/85* (2023.02)

(58) Field of Classification Search
    USPC ......................................................... 365/158
    See application file for complete search history.

(56) References Cited

U.S. PATENT DOCUMENTS

| | | | |
|---|---|---|---|
| 2015/0041934 A1* | 2/2015 | Khvalkovskiy | H10N 50/10 257/421 |
| 2019/0088857 A1* | 3/2019 | Park | H10N 50/10 |
| 2020/0006630 A1* | 1/2020 | Sato | H10B 61/00 |
| 2020/0106002 A1* | 4/2020 | Song | G11C 11/18 |
| 2021/0193912 A1* | 6/2021 | Gupta | G11C 11/1673 |

FOREIGN PATENT DOCUMENTS

| | | |
|---|---|---|
| KR | 10-2012-0028072 A | 3/2012 |
| KR | 10-2012-0062748 A | 6/2012 |
| KR | 10-2012-0098832 A | 9/2012 |
| KR | 10-2015-0018413 A | 2/2015 |
| KR | 10-2016-0010630 A | 1/2016 |
| KR | 10-2016-0064077 A | 6/2016 |
| KR | 10-2017-0036418 A | 4/2017 |
| KR | 10-2017-0045692 A | 4/2017 |

* cited by examiner

[FIG. 1]
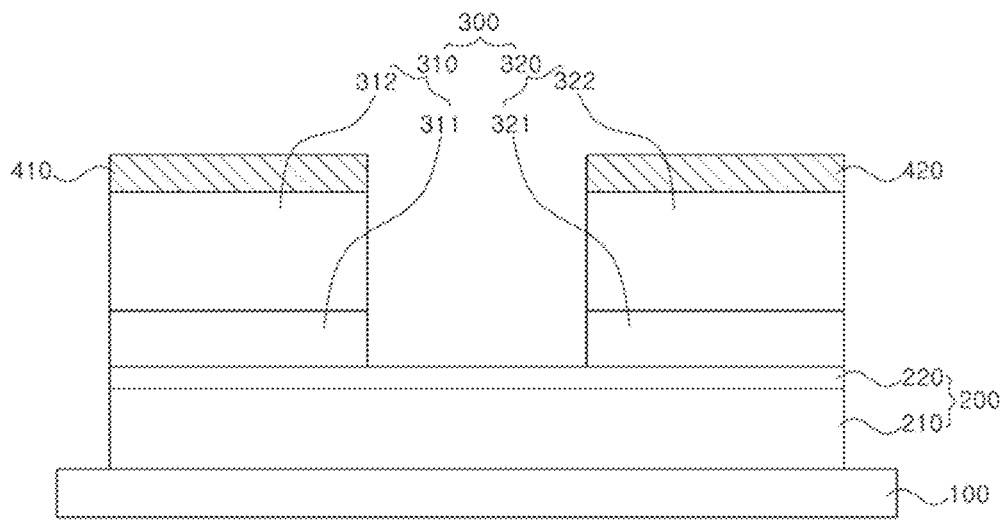
[FIG. 2]
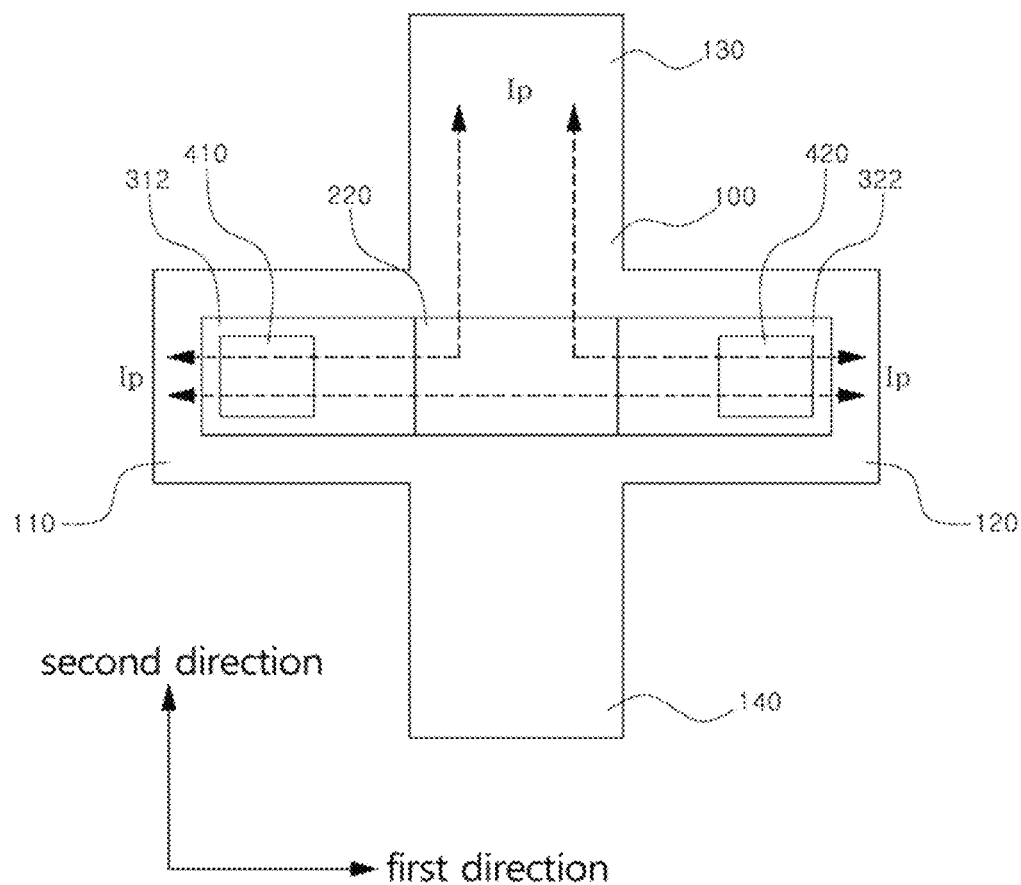

[FIG. 3]
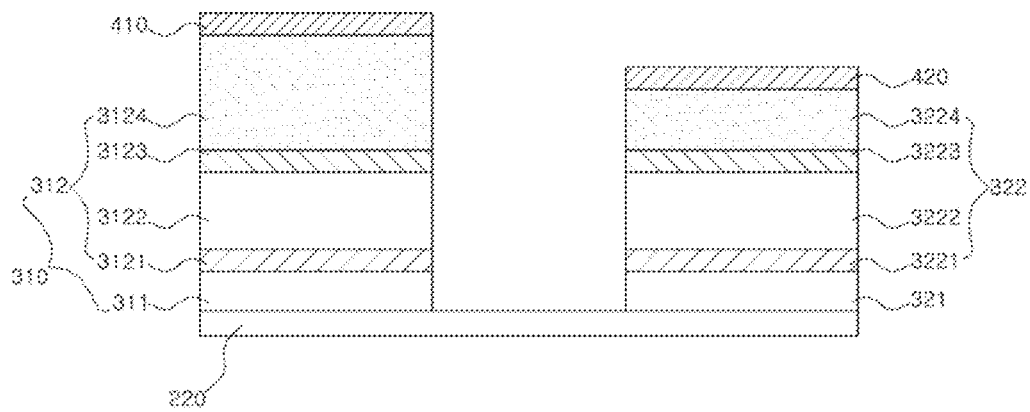
[FIG. 4]
[FIG. 5]
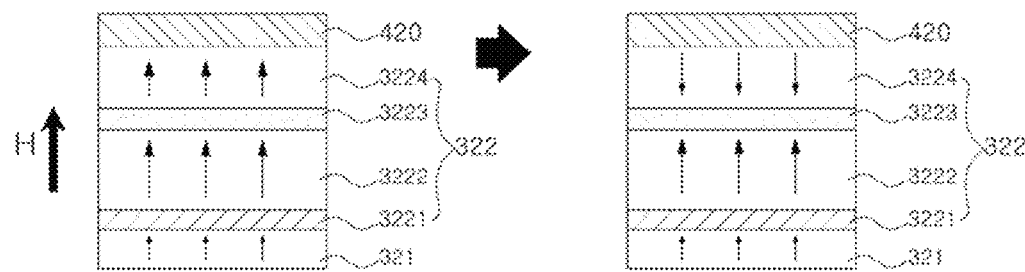

[FIG. 6]
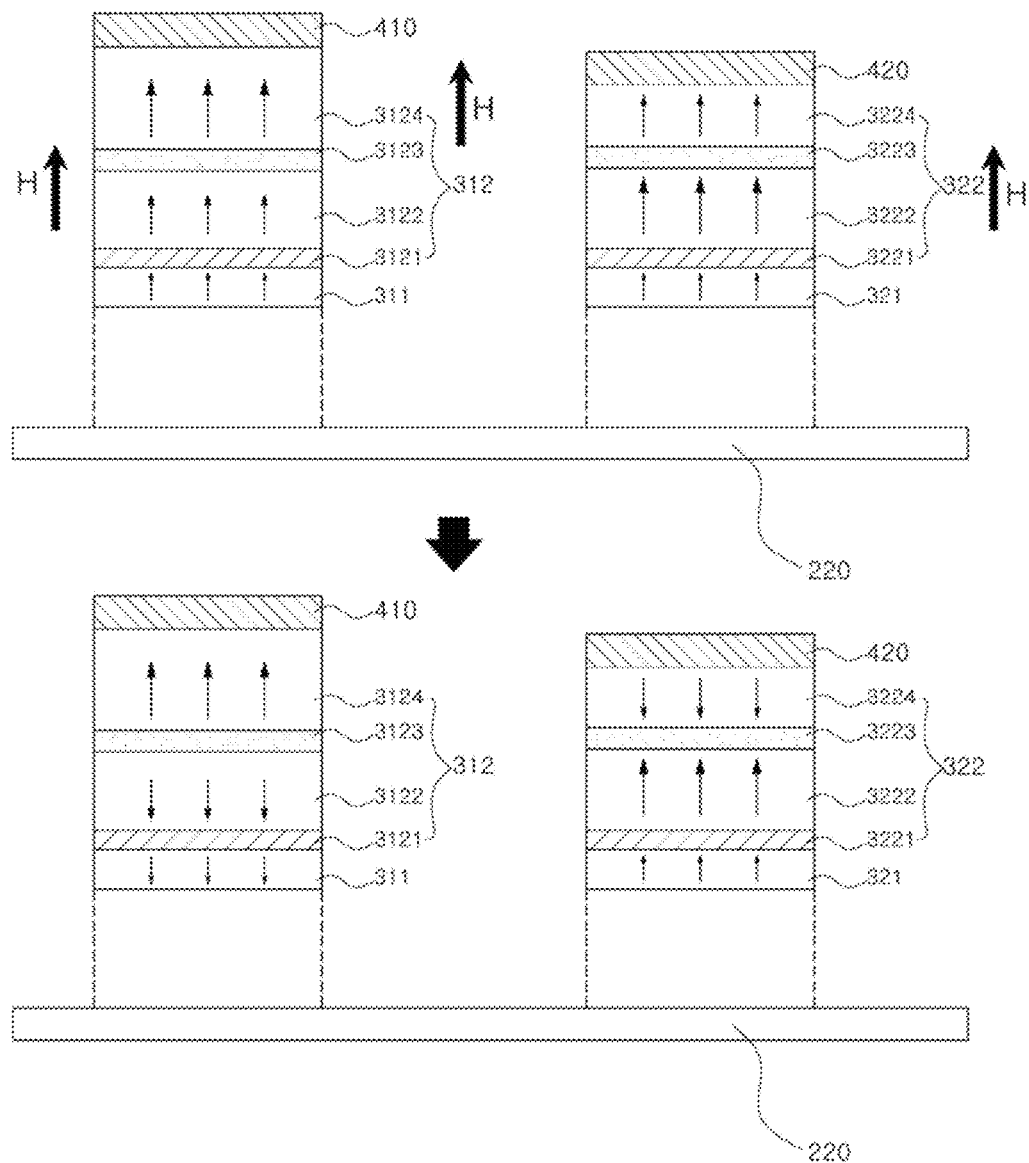

[FIG. 7]
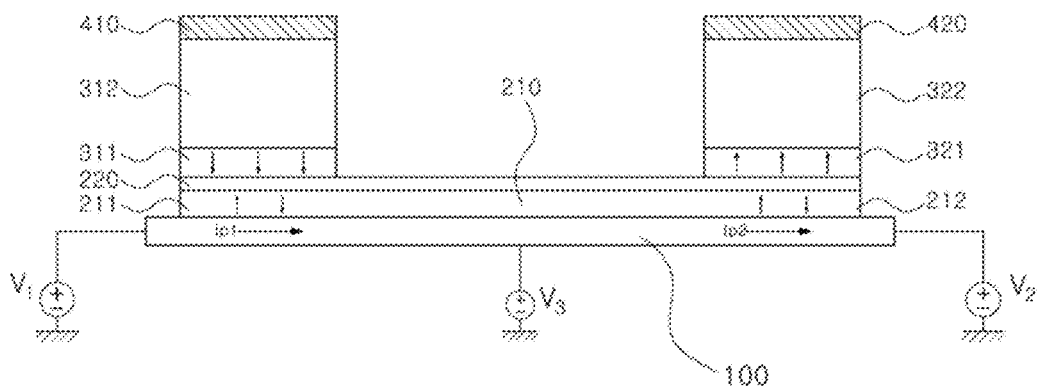
[FIG. 8]
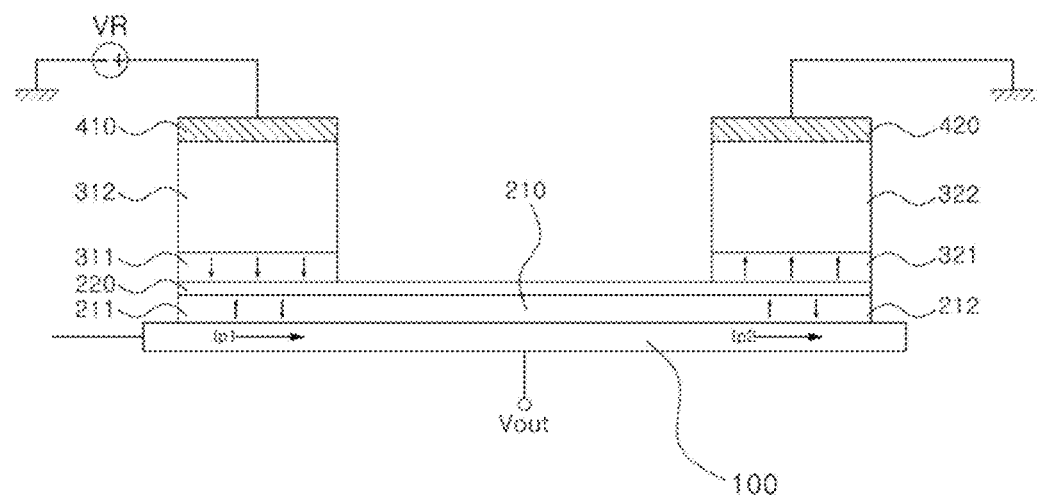

[FIG. 9]
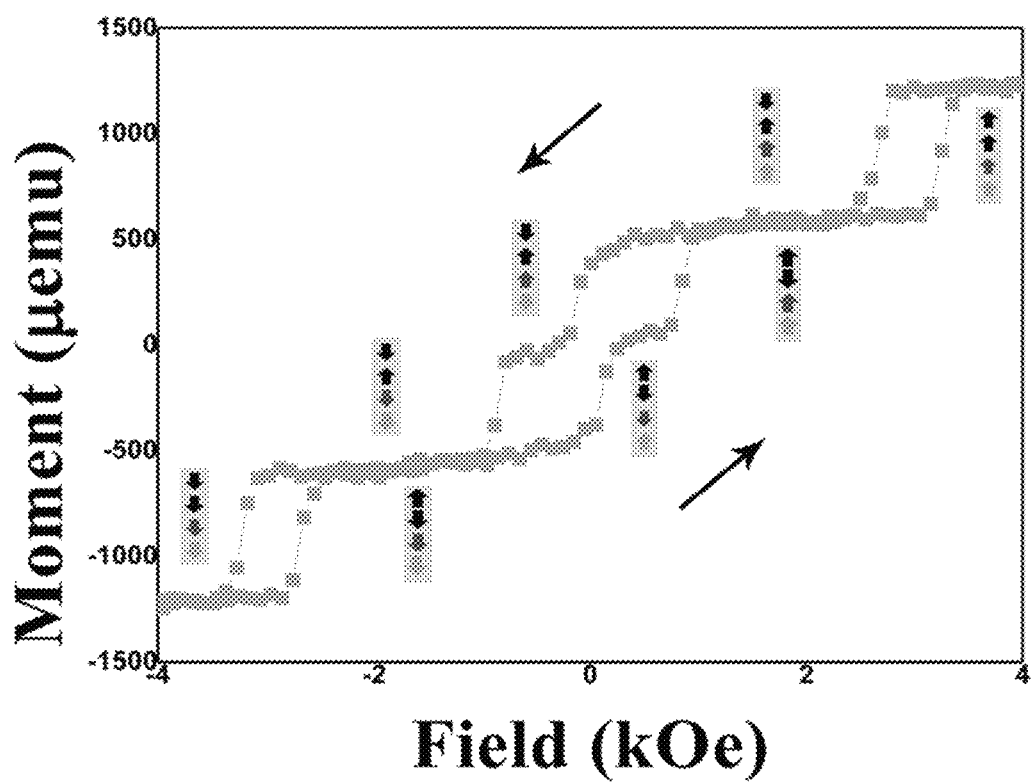

[FIG. 10]
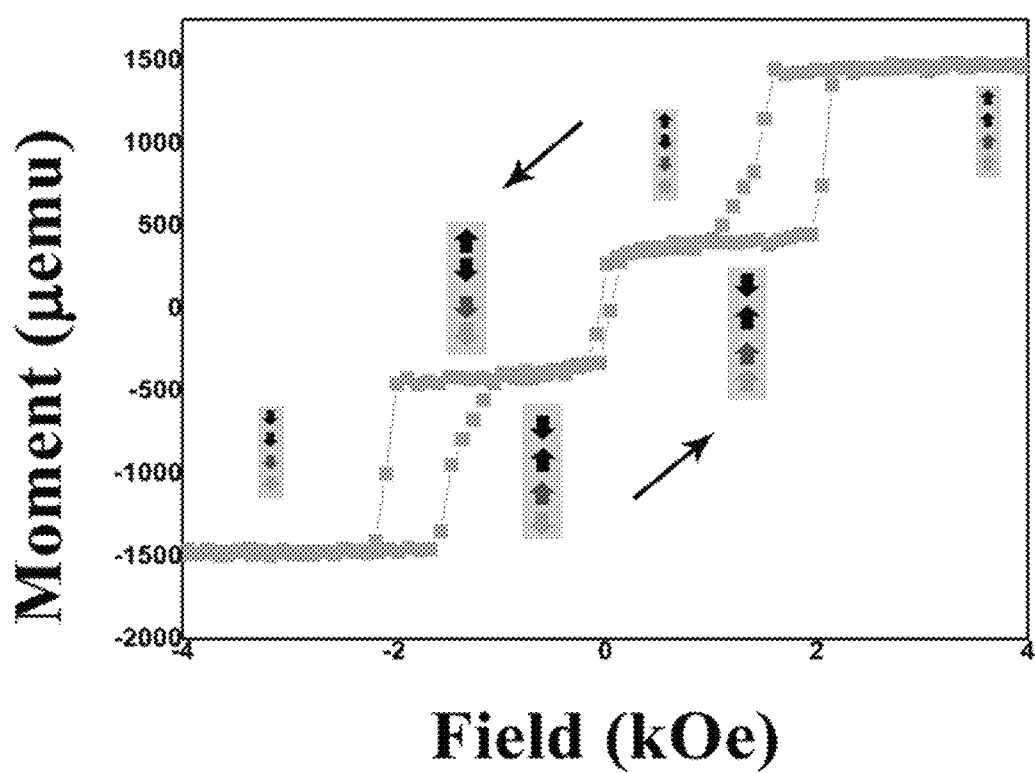

LOGIC ELEMENT USING SPIN-ORBIT TORQUE AND MAGNETIC TUNNEL JUNCTION STRUCTURE

CROSS REFERENCE TO RELATED APPLICATIONS

This application is a National Stage of International Application No. PCT/KR2021/002337 filed Feb. 25, 2021, claiming priority based on Korean Patent Application No. 10-2020-0031196 filed Mar. 13, 2020.

TECHNICAL FIELD

The present invention relates to a logic device using a magnetic tunnel junction structure, and more particularly, to a logic device inducing magnetic switching of a free layer using spin orbital torque, and capable of implement various logic operations using a change in resistance state according to the induced magnetization direction.

BACKGROUND ART

A logic device processes a digital signal and has various arithmetic functions. In addition, the logic devices are variously combined as combinational logic or sequential logic according to the will of the designer. In a combinational logic, the present output is determined by the present input regardless of the previous input. In a sequential logic, the present output is determined by the previous input. In particular, the sequential logic uses a storage device to store previous outputs.

A logic device using CMOS has three circuits as a basic unit. The basic unit perform the function of NAND, NOR or NOT. A digital signal may be calculated by a combination of these basic units.

In a logic device using CMOS, a NAND circuit requires four transistors. It has two input terminals and one output terminal. Further, the NOR circuit requires four transistors, and the NOT circuit requires two transistors because it has an inverter configuration.

In addition, in order to implement a logic circuit using a semiconductor process, the layout of the logic device of each basic unit is required. Therefore, three kinds of layouts are required as a minimum. In addition, when the logic device of each of these basic units are implemented as transistors, there is a limitation in minimizing design rule for device size. In the case of a NAND-type flash memory, a technology for vertically stacking cells is used, and a technology for improving the degree of integration has been commercialized.

However, when the chip size of the transistor is reduced, the length of the channel region is reduced and a short channel effect occurs, resulting in a leakage current between the source and the drain. To overcome short channel effect, a fin-FET structure that has the channel region of a transistor in a three-dimensional structure has been commercialized. However, in order to form a fin-FET structure, an etching process for forming a channel region protruding from the surface needs to be necessarily performed. That is, there is a problem that a plurality of processes are required to manufacture one transistor.

If NAND, NOR, and NOT operations can be selectively performed by devices having the same structure, this will have a great advantage. In addition, if the transistor is completely excluded or partially excluded from the unit logic device, it is a great advantage to implement a logic circuit. However, since the formation of a transistor is premised in CMOS, it is impossible to exclude a transistor when manufacturing a unit logic device.

On the other hand, device using magnetic tunnel junction (MTJ) is used as magnetic memory. That is, the magnetic tunnel junction is composed of a free layer, a tunnel layer, and a pinned end, and the resistance is determined by the parallel and antiparallel states of the magnetization direction of the free layer and the pinned end. A change in resistance is interpreted as a change in the storage state of the memory. That is, the unit cell of the memory is realized through the change of the resistance state.

In addition, in recent years, the switching operation of the magnetization at the free layer is performed by the spin orbit torque. Spin orbital torque refers to a spin rotational force generated in a magnetic layer by spin orbit coupling when a current flows in a non-magnetic layer in a structure in which a magnetic layer and a non-magnetic layer are formed. That is, a current is applied to the non-magnetic layer, and rotational force is generated with respect to the magnetization of the ferromagnetic material by spin orbit coupling. Magnetic switching occurs by the rotational force applied to the magnetization of the ferromagnetic material. When the magnetization of the free layer by magnetic switching and the magnetization of the pinned layer are parallel to each other, a low resistance state is realized, and when the magnetizations in opposite directions are set, a high resistance state is realized.

If MTJ structures are properly combined and the use of a transistor is excluded, the power consumed when the device is operated can be reduced. In particular, if a transistor is not used, the degree of integration of a logic device can be remarkably improved.

DISCLOSURE

Technical Problem

The present invention is directed to providing a logic device in which transistors are excluded and various logics can be implemented in one device.

Technical Solution

One aspect of the present invention provides logic device comprising. The logic device has a non-magnetic metal layer through which a program current for generating spin orbital torque flows or output voltage is received, a lower magnetic part formed on the non-magnetic metal layer and having perpendicular magnetic anisotropy set by the program current, and an upper magnetic part formed on the lower magnetic part and having at least two pinned magnetization units that are spaced apart from each other and face each other.

Another aspect of the present invention provides logic device. The logic device includes a non-magnetic metal layer having a cross-shaped structure to which a program current is applied, a first magnetic tunnel junction formed on the non-magnetic metal layer, a first magnetization inducing unit formed on the first magnetic tunnel junction and to induce magnetization of a first pinned layer of the first magnetic tunnel junction, a second magnetic tunnel junction formed on the non-magnetic metal layer and facing the first magnetic tunnel junction, and a second magnetization inducing unit formed on the second magnetic tunnel junction and to induce magnetization of a second pinned layer of the second magnetic tunnel junction. The magnetization of the first pinned layer has a direction opposite to that of the second pinned layer.

Advantageous Effects

According to the present invention, the upper magnetic part has two pinned magnetization units, and the pinned magnetization units are disposed to face each other. The pinned magnetization units share a common free layer and a common tunnel junction layer. The current flowing through the cross-shaped non-magnetic metal layer is used as an input to implement the resistance state of each magnetic tunnel junction, and one terminal of the cross-shaped non-magnetic metal layer is used as output terminal. Through this, various logical operations can be implemented.

Effects of the present invention are not limited to the above-described effects and other unmentioned effects may be clearly understood by those skilled in the art from the following descriptions.

DESCRIPTION OF DRAWINGS

FIG. 1 is a cross-sectional view of a logic device according to a preferred embodiment of the present invention.

FIG. 2 is a top plan view of the logic device of FIG. 1 according to a preferred embodiment of the present invention.

FIG. 3 is a cross-sectional view illustrating an upper magnetic part of the logic device of FIG. 1 according to a preferred embodiment of the present invention.

FIG. 4 is a schematic diagram for explaining the setting of a magnetization direction of a first pinned layer according to an embodiment of the present invention.

FIG. 5 is a schematic diagram for explaining the setting of a magnetization direction of a second pinned layer according to a preferred embodiment of the present invention.

FIG. 6 is a schematic diagram for explaining an operation when an external magnetic field is simultaneously applied to the magnetic layers disclosed in FIGS. 4 and 5 according to a preferred embodiment of the present invention.

FIG. 7 is a schematic diagram for explaining a program operation of the logic device of FIG. 1 according to a preferred embodiment of the present invention.

FIG. 8 is a schematic diagram for explaining a read operation of the logic device of FIG. 1 according to a preferred embodiment of the present invention.

FIG. 9 is a graph illustrating Vibrating Sample Magnetometer (VSM) data of a first magnetic tunnel junction according to preparation example 1 of the present invention.

FIG. 10 is a graph illustrating Vibrating Sample Magnetometer (VSM) data of a second magnetic tunnel junction according to a Preparation Example 2 of the present invention.

MODES OF THE INVENTION

While the present invention is susceptible to various modifications and alternative forms, specific embodiments thereof are shown by way of example in the drawings and will herein be described in detail. However, it should be understood that there is no intent to limit the invention to the particular forms disclosed but rather the invention is to cover all modifications, equivalents, and alternatives falling within the spirit and scope of the invention defined by the appended claims.

Unless defined otherwise, all terms used herein, including technical or scientific terms, have the same meaning as commonly understood by one of ordinary skill in the art to which this invention belongs. Terms such as those defined in a commonly used dictionary should be interpreted as having a meaning consistent with the meaning in the context of the related art, and are not interpreted in an excessively formal meaning unless explicitly defined in the present application.

Hereinafter, embodiments of the present invention will be described in detail with reference to the accompanying drawings.

Embodiment

FIG. 1 is a cross-sectional view of a logic device according to a preferred embodiment of the present invention.

Referring to FIG. 1, the logic device has a non-magnetic metal layer 100, a lower magnetic part 200, and an upper magnetic part 300.

The non-magnetic metal layer 100 is formed on the substrate, and the lower magnetic part 200 is formed on the non-magnetic metal layer 100. The magnetization state of the lower magnetic part 200 is changed according to the direction of the current flowing through the non-magnetic metal layer 100.

The lower magnetic part 200 has a common free layer 210 and a common tunnel junction layer 220. The common free layer 210 is a ferromagnetic material, and a magnetization direction is determined by a current flowing through the non-magnetic metal layer 100. In particular, the common free layer 210 has perpendicular magnetic anisotropy. The perpendicular magnetic anisotropy refers to a magnetization direction of the common free layer 210, which is a ferromagnetic material, aligned perpendicular to an interface with the common tunnel junction layer 220.

The common tunnel junction layer 220 disposed on the common free layer 210 is composed of an insulating material and is made of a material such as MgO through which tunnel electrons can pass.

The upper magnetic part 300 is formed on the lower magnetic part 200. The upper magnetic unit 300 includes a first pinned magnetization unit 310 and a second pinned magnetization unit 320. Each pinned magnetization unit has a pinned layer and a magnetization inducing unit.

Accordingly, the first pinned magnetization unit 310 has a first pinned layer 311 and a first magnetization inducing unit 312, and the second pinned magnetization unit 320 has a second pinned layer 321 and a second magnetization inducing unit 322. In particular, the first pinned layer 311 and the second pinned layer 321 have pinned magnetizations opposite to each other.

When an external strong magnetic field is applied in a temperature atmosphere of about 500° C. of the process of setting the initial pinned magnetization, the first pinned layer 311 and the second pinned layer 321 is magnetized in opposite directions. That is, even when an external magnetic field is applied in the same direction, the first pinned layer 311 and the second pinned layer 321 are magnetized in opposite directions by the operation of the first magnetization inducing unit 312 and the second magnetization inducing unit 322.

In order to implement the above-described operation, the first pinned layer 311 forms a ferromagnetic coupling with the first magnetization inducing unit 321, and the second pinned layer 321 and the second magnetization inducing unit 322 form a ferromagnetic coupling with each other. In the present invention, ferromagnetic coupling refers to a phenomenon in which the magnetization states of at least two ferromagnetic layers in contact with each other are set to be the same. That is, even if the external magnetic field is removed, any ferromagnetic layer follows the magnetization state of a specific ferromagnetic layer having a relatively strong magnetic field in contact with it.

Also, the first pinned magnetization unit 310 and the second pinned magnetization unit 320 face each other and are formed on the common tunnel junction layer 220.

A first electrode 410 is formed on the first pinned magnetization unit 310, and a second electrode 420 is formed on the second fixed magnetization unit 320.

In the structure of FIG. 1, the first pinned layer 311, the common tunnel junction layer 220, and the common free layer 210 form a first magnetic tunnel junction. In addition, the second pinned layer 321, the common tunnel junction layer 220, and the common free layer 210 form a second magnetic tunnel junction. Each magnetic tunnel junction performs a resistance change operation. Specifically, first magnetic tunnel junction and second magnetic tunnel junction share a common tunnel junction layer 220 and a common free layer 210. Also, when the second electrode 420 is viewed from the first electrode 410, it is interpreted as a structure in which the first magnetic tunnel junction and the second magnetic tunnel junction are connected in series between the two electrodes 410 and 420.

The magnetization direction of the pinned layer of the magnetic tunnel junction is determined by the magnetization inducing unit, and the magnetization direction of the common free layer 210 of the magnetic tunnel junction is determined according to the direction of the current flowing through the non-magnetic metal layer 100. Accordingly, the parallel or antiparallel states of magnetization of the common free layer 210 and the pinned layers 311, 321 in the magnetic tunnel junction can be determined. In the present specification, parallel state of magnetization indicates that the magnetization directions of two adjacent ferromagnetic layers are in the same direction, and antiparallel state indicates that the magnetizations of two adjacent ferromagnetic layers are opposite to each other. The resistance state of the magnetic tunnel junction is determined by the parallel or antiparallel magnetization in the magnetic tunnel junction. When the magnetizations are parallel, the magnetic tunnel junction has a low resistance state, and when the magnetizations of the magnetic tunnel junction are antiparallel, the magnetic tunnel junction has a high resistance state.

The above-described magnetization direction of the common free layer 210 is determined according to the direction of the current flowing through the non-magnetic metal layer 100. However, those skilled in the art may use other suitable means for inducing magnetic switching of the common free layer 210. That is, by applying an external magnetic field perpendicular to the direction of the current flowing through the non-magnetic metal layer 100, magnetic switching of the common free layer 210 may be induced in a desired direction.

In addition, magnetic switching may be induced by disposing a material capable of generating a magnetoelectric effect under the non-magnetic metal layer 100. The material generating magnetoelectric effect may be magnetized by an electric field generated by a current flowing through the non-magnetic metal layer 100 to form a magnetic field. In addition, the common free layer 210 and the material generating magnetoelectric effect disposed in a crossbar shape easily change the magnetization of the common free layer 210. However, a thin film insulating material needs to be disposed between the non-magnetic metal layer 100 and the material generating magnetoelectric effect. Bismuth or iron oxide may be used as material generating the magnetoelectric effect.

Also, the thickness and height of each layer are somewhat exaggerated in FIG. 1. The exaggerated representation of the drawings is a means for those skilled in the art to more easily understand the present invention, and the difference in heights of the pinned magnetization units 310 and 320 will be described later.

FIG. 2 is a top plan view of the logic device of FIG. 1 according to a preferred embodiment of the present invention.

Referring to FIG. 1 and FIG. 2, the non-magnetic metal layer 100 is formed in a cross shape on a substrate. In addition, the lower magnetic part 200 and the upper magnetic part 300 are formed along the first direction. However, since FIG. 2 is a plan view viewed from the top of FIG. 1, the first magnetization inducing unit 312 of the first pinned magnetization unit 310 and the second magnetization inducing unit 322 of the second pinned magnetization unit 320 are exposed. Also, the common tunnel junction layer 220 is exposed between the first magnetization inducing unit 312 and the second magnetization inducing unit 322.

Also, the first electrode 410 formed on the first magnetization induction unit 312 and the second electrode 420 formed on the second magnetization induction unit 322 appear. However, the first electrode 410 is shown to cover the entire first magnetization induction unit 312 in FIG. 1 for convenience of description, and as shown in FIG. 2, the first electrode 410 may cover only a partial region of the first magnetization inducting unit 312. This is equally applied to the second electrode 420.

The program current Ip may flow in the first direction or in a reverse direction to the first direction in the non-magnetic metal layer 100. The magnetization direction of the common free layer is determined by the applied program current Ip.

The cross-shaped non-magnetic metal layer 100 has a first terminal 110, a second terminal 120, a third terminal 130, and a fourth terminal 140. The direction of the program current Ip may be determined by a voltage difference applied to the first terminal 110, the second terminal 120, and the third terminal 130. For example, when a voltage difference is applied to the first terminal 110 and the second terminal 120, and when the third terminal 130 and the fourth terminal 140 are set to a floating state, program current Ip flowing in a straight line between the first terminal 110 and the second terminal 120 may be obtained.

The program current Ip may flow in various directions due to a voltage difference between the first terminal 110 and the second terminal 120. If the third terminal 130 has a predetermined voltage difference with the first terminal 110 or the second terminal 120, program current Ip flowing the third terminal 130 and the region under the common tunnel junction layer 220 exposed may flow in the second direction and may flow in a reverse direction of the second direction.

For example, when the third terminal 130 has a higher voltage than the first terminal 110 and the second terminal 120, the program current Ip flows in the direction of the first electrode 110 in the region under the first pinned magnetization unit 310 and flows in the direction of the second terminal 120 in the region under the second pinned magnetization unit 320. In addition, when the first terminal 110 and the second terminal 120 have a higher voltage than the third terminal 130, the program current Ip flows in the first direction in the region under the first pinned magnetization unit 310, and flows in a direction opposite to the first direction in the region under the second pinned magnetization unit 320.

That is, the program current Ip flowing under the first pinned magnetization unit 310 and the second pinned magnetization unit 320 by voltage control of the first terminal 110, the second terminal 120 and the third terminal 130 can be arbitrarily adjusted.

The perpendicular magnetic anisotropy of the common free layer 210 is determined by the direction of the program current Ip flowing through the non-magnetic metal layer 100. That is, if the program current Ip flowing through the lower portion of the first pinned magnetization unit 310 and the program current Ip flowing through the lower portion of the second pinned magnetization unit 320 are in the same direction, the magnetization of the common free layer 210 is set in the same direction. In addition, if the program current Ip flowing through the lower portion of the first pinned magnetization unit 310 and the program current Ip flowing through the lower portion of the second pinned magnetization unit 320 are opposite to each other, the magnetization of the common free layer 210 may be set in opposite directions according to regions within one layer. For example, the region of the common free layer 210 under the first pinned magnetization unit 310 may have upward magnetization, and the region of the common free layer 210 under the second pinned magnetization unit 320 may have upward magnetization. and vice versa depending on the direction of the applied program currents Ip.

The perpendicular magnetic anisotropy of the common free layer 210 is determined by the program current Ip flowing through the non-magnetic metal layer 100. In addition, the resistance of the first magnetic tunnel junction by the common free layer 210 and the first pinned layer 311 and the resistance of the second magnetic tunnel junction by the common free layer 210 and the second pinned layer 321 are determined by the input operation for the program current Ip. However, the first pinned layer 311 and the second pinned layer 321 have perpendicular magnetic anisotropy in mutually opposite directions. This is defined as complementary perpendicular magnetic anisotropy.

After the input operation of the program current Ip, the output operation is performed. In the output operation, a read voltage is applied between the first electrode 110 and the second electrode 120, and the output voltage is received through the fourth terminal 140 of the cross-shaped structure of the lower non-magnetic metal layer 100. When the output operation is performed, the application of the program current Ip is stopped. When the read voltage is applied, a current path including the first electrode 410, the first pinned magnetization unit 310, the common tunnel junction layer 220, the common free layer 210, the common tunnel junction layer 220, the second pinned magnetization unit 320 and the second electrode 420 is formed. If interpreted as another element, the current path including the first electrode 410, the first magnetization inducing unit 312, the first magnetic tunnel junction, the second magnetic tunnel junction, the second magnetization inducing unit 322 and the second electrode 420 is formed. In the magnetic tunnel junction, the resistance state is determined by the parallel state or anti-parallel state of magnetization of the pinned layer and the common free layer. In addition, since it is interpreted that the non-magnetic metal layer 100 is connected between the series connection structure of the first magnetic tunnel junction and the second magnetic tunnel junction when the read voltage is applied, the voltage state can be detected through the fourth terminal 140. In this case, various levels of output voltage can be obtained.

FIG. 3 is a cross-sectional view illustrating an upper magnetic part of the logic device of FIG. 1 according to a preferred embodiment of the present invention.

Referring to FIG. 3, the upper magnetic part has a first pinned magnetization unit 310 and a second pinned magnetization unit 320, and the first pinned magnetization unit 310 and the second pinned magnetization unit 320 face each other based on a spaced apart space on the common tunnel junction layer 220.

In addition, the first pinned magnetization unit 310 includes a first pinned layer 311 and a first magnetization inducing unit 312, and the second pinned magnetization unit 320 includes a second pinned layer 321 and a second magnetization inducing unit 322.

The first magnetization inducing unit 312 includes a first ferromagnetic coupling inducing layer 3121, a first intermediate ferromagnetic layer 3122, a first antiferromagnetic coupling inducing layer 3123 and a first upper ferromagnetic layer 3124. In addition, the second magnetization inducing unit 322 includes a first ferromagnetic coupling inducing layer 3221, a second intermediate ferromagnetic layer 3222, a second antiferromagnetic coupling inducing layer 3223 and second upper ferromagnetic layer 3224.

When the configuration of the first magnetization inducing unit 312 is compared with that of the second magnetization inducing part 322, the material and thickness of the layers are the same, and ferromagnetic or antiferromagnetic coupling is made between the layers. However, the first upper ferromagnetic layer 3124 may have the same material with the second upper ferromagnetic layer 3224, but may have a greater thickness than the second upper ferromagnetic layer 3224.

A first ferromagnetic coupling inducing layer 3121 is formed on the first pinned layer 311, and a first intermediate ferromagnetic layer 3122 is formed on the first ferromagnetic coupling inducing layer 3121.

The first pinned layer 311 and the first intermediate ferromagnetic layer 3122 perform ferromagnetic coupling by the first ferromagnetic coupling inducing layer 3121. The ferromagnetic coupling between the first pinned layer 311 and the first intermediate ferromagnetic layer 3122 is due to the RKKY interaction (Ruderman-Kittel-Kasuya-Yosida interaction). The RKKY interaction is related to the coupling mechanism of the nuclear magnetic moment in the metal or the electron spin of the local internal d or f orbital through the interaction of conduction electrons. Depending on the specific layer thickness that induces the RKKY interaction, the probability that the spins of electrons can be aligned in one direction in a ferromagnetic material is changed. Also, the probability that a spin electron will have an up spin or a down spin at a particular point may be expressed in the form of a wavelength.

Accordingly, depending on the material and thickness of the first ferromagnetic coupling inducing layer 3121, the first pinned layer 311 and the first intermediate ferromagnetic layer 3122 may be antiferromagnetically coupled or ferromagnetically coupled. In the case of antiferromagnetic coupling, two facing ferromagnetic layers are in an antiparallel state having spins in opposite directions to each other, and in the case of ferromagnetic coupling, two facing ferromagnetic layers are in a parallel state having spins in the same direction.

The first pinned layer 311 and the first intermediate ferromagnetic layer 3122 are ferromagnetically coupled by the first ferromagnetic coupling inducing layer 3121 and have magnetization states in the same direction. The same applies to the second intermediate ferromagnetic layer 3222 and the second pinned layer 321. That is, the second pinned layer 321 and the second intermediate ferromagnetic layer 3222 have magnetization states in the same direction by the second ferromagnetic coupling inducing layer 3221.

A first antiferromagnetic coupling inducing layer 3123 and a first upper ferromagnetic layer 3124 are formed on the first intermediate ferromagnetic layer 3122. The first intermediate ferromagnetic layer 3122 and the first upper ferromagnetic layer 3124 form an antiferromagnetic coupling by the first antiferromagnetic coupling inducing layer 3123. That is, the first intermediate ferromagnetic layer 3122 and the first upper ferromagnetic layer 3124 have opposite magnetizations to each other.

In addition, the second intermediate ferromagnetic layer 3222 and the second upper ferromagnetic layer 3224 also form an antiferromagnetic coupling by the second antiferromagnetic coupling inducing layer 3223. Accordingly, the second intermediate ferromagnetic layer 3222 and the second upper ferromagnetic layer 3224 have opposite magnetizations to each other.

The strength of the antiferromagnetic coupling in the first pinned magnetization unit 310 may be set to be greater than the strength of the ferromagnetic coupling. Also, the strength of the ferromagnetic coupling in the second pinned magnetization unit 320 may be set to be greater than the strength of the antiferromagnetic coupling.

A first electrode 410 is formed on the first upper ferromagnetic layer 3124, and a second electrode 420 is formed on the second upper ferromagnetic layer 3224.

The first intermediate ferromagnetic layer 3122, the first antiferromagnetic coupling inducing layer 3123 and the first upper ferromagnetic layer 3124 may induce a giant magnetoresistance effect. That is, at the interfaces of these three types of layers, a phenomenon in which the electrical resistance is changed according to the change of the magnetization state is induced. This is due to the fact that the first antiferromagnetic coupling inducing layer 3123 is a non-magnetic metal material. However, the resistance change rate is less than 5%, so the degree to which the change in magnetization in the first intermediate ferromagnetic layer 3122 and the first upper ferromagnetic layer 3124 causes the change in resistance is insignificant. The resistance change effect due to the first magnetic tunnel junction by the common free layer, the common tunnel junction layer 220 and the first pinned layer 311 is very large. The same applies to the second magnetic tunnel junction.

Therefore, the resistance state in the first magnetic tunnel junction is determined by the parallel state or antiparallel state of the magnetizations of the common free layer 220 and the first pinned layer 311, and the resistance state in the second magnetic tunnel junction is determined by the parallel state or antiparallel state of magnetization of the common free layer 220 and the second pinned layer 321.

The magnetization strength of the first intermediate ferromagnetic layer 3122 is higher than the magnetization strength of the first pinned layer 311. To this end, the first intermediate ferromagnetic layer 3122 preferably has a greater thickness than the first pinned layer 311. Since the magnetization intensity of the second intermediate ferromagnetic layer 3222 has a higher value than that of the second pinned layer 321, the second intermediate ferromagnetic layer 3222 preferably has a greater thickness than the second pinned layer 321.

Also, the magnetization strength of the first upper ferromagnetic layer 3124 is higher than the magnetization strength of the first intermediate ferromagnetic layer 3122. To this end, the first upper ferromagnetic layer 3124 preferably has a greater thickness than the first intermediate ferromagnetic layer 3122. Accordingly, the antiferromagnetic coupling in the first pinned magnetization unit 310 has a greater magnetic moment than the ferromagnetic coupling.

Also, the magnetization strength of the second upper ferromagnetic layer 3224 has a lower value than that of the second intermediate ferromagnetic layer 3222. To this end, the second upper ferromagnetic layer 3224 preferably has a smaller thickness than the second intermediate ferromagnetic layer 3222. Accordingly, in the second pinned magnetization unit 320, the ferromagnetic coupling has a greater magnetic moment than the antiferromagnetic coupling. That is, the antiferromagnetic coupling in the second magnetization inducing unit 322 has a larger magnetic moment than the ferromagnetic coupling, and the magnetization of the second intermediate ferromagnetic layer 3222 has the largest value.

FIG. 4 is a schematic diagram for explaining the setting of a magnetization direction of a first pinned layer according to an embodiment of the present invention.

In FIG. 4, the first upper ferromagnetic layer 3124 has a greater magnetization strength than the first intermediate ferromagnetic layer 3122. Also, the first intermediate ferromagnetic layer 3122 has a greater magnetization strength than the first pinned layer 311.

When the external magnetic field H is applied in the upward direction, the magnetization of all magnetic layers is set in the upward direction. That is, the magnetization direction of all ferromagnetic materials is upward due to a magnetic field strong enough to overcome the antiferromagnetic coupling between the first intermediate ferromagnetic layer 3122 and the first upper ferromagnetic layer 3124.

Then, when the external magnetic field H is removed, antiferromagnetic coupling is realized between the first intermediate ferromagnetic layer 3122 and the first upper ferromagnetic layer 3124. However, since the first upper ferromagnetic layer 3124 has the greatest magnetization even if an antiferromagnetic coupling force is applied, the magnetization direction of the first upper ferromagnetic layer 3124 is not changed, and operation of the magnetic switching in which the magnetization direction of the first intermediate ferromagnetic layer 3122 is downward is performed. Accordingly, the magnetization of the first intermediate ferromagnetic layer 3122 is stabilized by antiferromagnetic coupling.

In addition, the first intermediate ferromagnetic layer 3122 and the first pinned layer 311 form a ferromagnetic coupling. Since the first intermediate ferromagnetic layer 3122 has a greater magnetization than the first pinned layer 311, the magnetization direction of the first pinned layer 311 is determined by the magnetization direction of the first intermediate ferromagnetic layer 3122. The first intermediate ferromagnetic layer 3122 has a downward magnetization by antiferromagnetic coupling with the first upper ferromagnetic layer 3124. In addition, since the first pinned layer 311 forms a ferromagnetic coupling with the first intermediate ferromagnetic layer 3122, the first pinned layer 311 also has downward magnetization. The magnetization of the first pinned layer 311 is aligned through the mechanism described above.

In addition, when the external magnetic field H is directed downward, the magnetization direction of the ferromagnetic materials is downward due to the strong magnetic field. Also, when the external magnetic field H is removed, the strongest magnetized first upper ferromagnetic layer 3124 maintains downward magnetization. The magnetization of the first intermediate ferromagnetic layer 3122 is aligned upward by antiferromagnetic coupling. In addition, since the first intermediate ferromagnetic layer 3122 and the first pinned layer 311 perform ferromagnetic coupling, the magnetization of the first pinned layer 311 is aligned as same direction with the magnetization direction of the first intermediate ferromagnetic layer 3122. Accordingly, the magnetization direction of the first pinned layer 311 is aligned to face upward.

FIG. 5 is a schematic diagram for explaining the setting of a magnetization direction of a second pinned layer according to a preferred embodiment of the present invention.

Referring to FIG. 5, the second intermediate ferromagnetic layer 3222 has a greater magnetization strength than the second upper ferromagnetic layer 3224. In addition, the second intermediate ferromagnetic layer 3222 has a greater magnetization strength than the second pinned layer 321. Accordingly, the second intermediate ferromagnetic layer 3222 preferably has a greater thickness than the second upper ferromagnetic 3224. In addition, the second intermediate ferromagnetic layer 3222 preferably has a greater thickness than the second pinned layer 322.

When the external magnetic field H is applied in the upward direction, the magnetization of all magnetic layers is set in the upward direction. That is, the magnetization direction of all ferromagnetic layers is upward due to a magnetic field strong enough to overcome the antiferromagnetic coupling between the second intermediate ferromagnetic layer 3222 and the second upper ferromagnetic layer 3224.

Then, when the external magnetic field H is removed, antiferromagnetic coupling is realized between the second intermediate ferromagnetic layer 3222 and the second upper ferromagnetic layer 3224. Since the second intermediate ferromagnetic layer 3222 is in a state stronger than that of the second upper ferromagnetic 3224, the magnetization of the second intermediate ferromagnetic layer 3222 maintains an upward direction, and magnetization the second upper ferromagnetic layer 3224 is switched by antiferromagnetic coupling. In addition, since ferromagnetic coupling appears between the second pinned layer 321 and the second intermediate ferromagnetic layer 3222, the magnetization state of the second pinned layer 321 is aligned to upward without magnetic switching.

Also, when the external magnetic field H is directed downward, the magnetization of all ferromagnetic layers is downward. Subsequently, when the external magnetic field H is removed, the second intermediate ferromagnetic layer 3222 is in the strongest magnetized state and maintains an antiferromagnetic coupling with the second upper ferromagnetic layer 3224, so that magnetic switching is performed in the second upper ferromagnetic layer 3224, and the magnetization direction of the second upper ferromagnetic layer 3224 is upward. In addition, the magnetization of the second pinned layer 321 maintaining ferromagnetic coupling with the second intermediate ferromagnetic layer 3222 is aligned downward.

FIG. 6 is a schematic diagram for explaining an operation when an external magnetic field is simultaneously applied to the magnetic layers disclosed in FIGS. 4 and 5 according to a preferred embodiment of the present invention.

Referring to FIG. 6, a first magnetization inducing unit 312 and a second magnetization inducing unit 322 are disclosed. The first magnetization inducing unit 312 is formed on the first pinned layer 311, and the second magnetization inducing unit 322 is formed on the second pinned layer 321. In addition, a portion indicated by a dotted line in FIG. 6 indicates a common free layer and a common tunnel junction layer formed on the non-magnetic metal layer 100.

The configuration of the first magnetization induction unit 312 is the same as described in FIG. 4. Accordingly, the first magnetization inducing unit 312 has a first ferromagnetic coupling inducing layer 3121, a first intermediate ferromagnetic layer 3122, a first antiferromagnetic coupling inducing layer 3123 and a first upper ferromagnetic layer 3124. The first upper ferromagnetic layer 3124 is magnetized stronger than the first intermediate ferromagnetic layer 3122 and has a greater thickness than the first intermediate ferromagnetic layer 3122. In addition, the first intermediate ferromagnetic layer 3122 and the first pinned layer 311 form a ferromagnetic coupling by the first ferromagnetic coupling inducing layer 3121. The first intermediate ferromagnetic layer 3122 and the first upper ferromagnetic layer 3124 form an antiferromagnetic coupling by the first antiferromagnetic coupling inducing layer 3123.

In addition, the configuration of the second magnetization inducing unit 322 is the same as described with reference to FIG. 5. The second magnetization inducing unit 322 includes a second ferromagnetic coupling inducing layer 3221, a second intermediate ferromagnetic layer 3222, a second antiferromagnetic coupling inducing layer 3223 and a second upper ferromagnetic layer 3224.

The second intermediate ferromagnetic layer 3222 is magnetized stronger than the second upper ferromagnetic layer 3224 and the lower second pinned layer 321, and has a thickness greater than that of the second upper ferromagnetic layer 3224 or the second pinned layer 321. In addition, the second intermediate ferromagnetic layer 3222 and the second pinned layer 321 form a ferromagnetic coupling by the second ferromagnetic coupling inducing layer 3221. The second intermediate ferromagnetic layer 3222 and the second upper ferromagnetic layer 3224 form an antiferromagnetic coupling by the second antiferromagnetic coupling inducing layer 3223.

When the external magnetic field H is applied to the first magnetization inducing unit 312 and the second magnetization inducing unit 322 in an upward direction, all ferromagnetic layers constituting the two magnetization inducing units 312 and 322 have an upward magnetic field. Then, when the external magnetic field H is removed, the magnetization of the ferromagnetic layers may be changed by antiferromagnetic coupling or ferromagnetic coupling.

Since the magnetization of the first upper ferromagnetic layer 3124 is the largest in the first magnetization inducing unit 312, the first pinned layer 311 is changed to a downward magnetization state. Since the second intermediate ferromagnetic layer 3222 has the largest magnetization in the second magnetization inducing unit 322, the lower second pinned layer 321 has an upward magnetization. That is, by the above-described configuration, the two pinned layers 313 and 321 have magnetization states in opposite directions to each other.

FIG. 7 is a schematic diagram for explaining a program operation of the logic device of FIG. 1 according to a preferred embodiment of the present invention.

Referring to FIGS. 2 and 7, three power supplies V1, V2, and V3 are connected to the logic device of FIG. 1. The first power V1 is connected to the first terminal 110 of the non-magnetic metal layer 100. The second power source V2 is connected to the second terminal 120 of the non-magnetic metal layer 100 facing to the first power source V1. In addition, the third power source V3 is connected to the third terminal 130 of the non-magnetic metal layer 100.

Also, a current flowing through the non-magnetic metal layer 100 and determining a magnetization direction of the common free layer 210 is referred to as a program current. In addition, for convenience of description, the common free layer under the first pinned layer 311 is referred to as the first free layer 211, and the common free layer under the second pinned layer 321 is referred to as the second free layer 212. Of course, it is assumed that the first free layer 211 and the second free layer 212 are electrically made of the same material, and there is no change in resistance of the film. The program current flowing between the lower portion of the first free layer 211 and the first terminal 110 is called a first program current Ip1, and a program current flowing between the lower portion of the second free layer 212 and the second terminal 120 is called the second program current Ip2. In addition, the program current flowing to the right is defined as (+), and the program current flowing to the left is defined as (−).

For better understanding by those skilled in the art, when the programming current flows in the (+) direction, the upper common free layer 210 is assumed to have upward magnetization, and when the program current flows in the (−) direction, the upper common free layer 210 is assumed to have downward magnetization. The direction of magnetization in the common free layer 210 according to the direction of the program current is for those skilled in the art to understand, and the direction of magnetization according to the direction of the program current may be set opposite to that described above.

Also, it is assumed that the first pinned layer 311 has downward magnetization and the second pinned layer 321 has upward magnetization. If the magnetization directions of the first pinned layer 311 and the second pinned layer 321 are opposite to each other, it does not depart from the spirit of the present invention.

The magnetization direction of the first pinned layer 311 is determined by the magnetic coupling state or magnetization alignment of the first magnetization inducing unit 312, and the magnetization direction of the second pinned layer 321 is the magnetic coupling state or magnetization alignment of the second magnetization inducing unit 322. This is the state described in detail with reference to FIGS. 3 to 6.

Each of the magnetic tunnel junctions may implement two resistance states according to the direction of the applied program current.

First, a case in which both the first program current Ip1 and the second program current Ip2 are in the (+) direction will be described. In order to realize the direction of the program current, the first power V1 may have a higher voltage than the second power V2, and the third power V3 may have floating state or have a voltage value between the first power V1 and the second power V2. According to the set assumption, the first free layer 211 has an upward magnetization, and the second free layer 212 also has an upward magnetization. Since the magnetization of the first free layer 211 is antiparallel to the magnetization of the first pinned layer 311, the first magnetic tunnel junction including the first pinned layer 311, the common tunnel junction layer 220 and the first free layer 211 has a high resistance state H. In addition, the second free layer 212 has upward magnetization and is parallel to the magnetization direction of the second pinned layer 321. Accordingly, the second magnetic tunnel junction composed of the second pinned layer 321, the common tunnel junction layer 220 and the second free layer 212 has a low resistance state L.

Also, the first program current Ip1 may have a (+) direction, and the second program current Ip2 may have a (−) direction. That is, two types of program currents may flow in opposite directions. To this end, the third power V3 may have the lowest voltage, and the first power V1 and the second power V2 may have a higher voltage than the third power V3. Due to the voltage difference, the first program current Ip1 flows to the right and the second program current Ip2 flows to the left. The first magnetic tunnel junction is in the high resistance state H by the first program current Ip1. The second free layer has downward magnetization by the second program current Ip2, and the second magnetic tunnel junction realizes a high resistance state H.

Also, the first program current Ip1 may have a (−) direction, and the second program current Ip2 may have a (+) direction. To this end, the third power V3 may have the highest voltage, and the first power V1 and the second power V2 may have a lower voltage than the third power V3. Due to the voltage difference, the first program current Ip1 flows to the left and the second program current Ip2 flows to the right. The first free layer 211 has downward magnetization by the first program current Ip1, and the first magnetic tunnel junction implements a low resistance state L. The second free layer 212 has upward magnetization by the second program current Ip2, and the second magnetic tunnel junction realizes a low resistance state L.

Also, the first program current Ip1 may have a (−) direction, and the second program current Ip2 may also have a (−) direction. To set the direction of the program currents, the second power V2 has a voltage higher than that of the first power V1, and the third power V3 may have floating state or have a value between the first power V1 and the second power V2. Due to the first program current Ip1 flowing in the left direction, the first free layer 211 has a downward magnetization and the first magnetic tunnel junction has a low resistance state L. In addition, the second free layer 212 has a downward magnetization due to the second program current Ip2 flowing in the left direction, and the second magnetic tunnel junction has a high resistance state H.

The four types of operations described above are summarized in Table 1 below.

TABLE 1

| Ip1 | Ip2 | FL1 | PL1 | FL2 | PL2 | R1 | R2 |
|---|---|---|---|---|---|---|---|
| + | + | ↓ | ↑ | ↓ | ↓ | H | L |
| + | − | ↓ | ↑ | ↑ | ↓ | H | H |
| − | + | ↑ | ↑ | ↓ | ↓ | L | L |
| − | − | ↑ | ↑ | ↑ | ↓ | L | H |

In Table 1, FL 1 denotes a magnetization direction of the first free layer 211, and FL 2 denotes a magnetization state of the second free layer 212. Also, PL represents the magnetization direction of the pinned layer. R1 denotes a resistance state of the first magnetic tunnel junction, and R2 denotes a resistance state of the second magnetic tunnel junction.

FIG. 8 is a schematic diagram for explaining a read operation of the logic device of FIG. 1 according to a preferred embodiment of the present invention.

Referring to FIGS. 2 and 8, after the program operation is performed, voltages V1, V2, and V3 applied to the non-magnetic metal layer 100 are removed. Accordingly, the resetting of magnetization in the common free layer 210 caused by the spin orbital torque does not appear. Also, the read voltage VR is connected to the first electrode 410, and the second electrode 420 is grounded. In addition, the output voltage Vout is received through the fourth terminal 140 of the non-magnetic metal layer 100. If the resistance of the first magnetization inducing unit 312 and the first magnetic tunnel junction is named as R1, and the resistance of the second magnetization induction part 322 and the second magnetic tunnel junction is named as R2, The output voltage Vout which is the output from the fourth terminal 140 as an output terminal becomes R2/(R1+R2)*VR. In addition, the reference voltage of the fourth terminal 140 is set to an appropriate value less than VR, and is used as a criterion for determining a logic high value and a logic low value. In addition, when two program currents are set as inputs, the output voltage Vout at the fourth terminal 140 is the output voltage, and the reference voltage is applied as a criterion for determining logic high and logic low, the operation of the logic device is summarized in Table 2 below.

TABLE 2

| Ip1 | Ip2 | R1 | R2 | Vout |
|---|---|---|---|---|
| + | + | H | L | Low |
| + | − | H | H | Mid |
| − | + | L | L | Mid |
| − | − | L | H | High |

In Table 2, when the reference voltage for determining logic low and logic high is set between Mid and High, a logic high appears only when both inputs Ip1 and Ip2 are (−). This becomes a NOR operation. If the reference voltage is set to a value between Mid and Low, a logic low appears only when both inputs Ip1 and Ip2 are (+). This becomes a NAND operation. That is, the NAND operation and the NOR operation may be implemented in the same device by a method of setting the level of the reference voltage for determining the logic high and low. In addition, when the magnetization direction at the pinned layers is set opposite to Table 1 above, even if the magnetization directions at the free layers are the same as in Table 1, the resistance states in the magnetic tunnel junctions are opposite to Table 1 above. This is shown in Table 3 below.

TABLE 3

| Ip1 | Ip2 | FL1 | PL1 | FL2 | PL2 | R1 | R2 |
|---|---|---|---|---|---|---|---|
| + | + | ↓ | ↓ | ↓ | ↑ | L | H |
| + | − | ↓ | ↓ | ↑ | ↑ | L | L |
| − | + | ↑ | ↓ | ↓ | ↑ | H | H |
| − | − | ↑ | ↓ | ↑ | ↑ | H | L |

When the read operation described in FIG. 8 is performed using the resistance state shown in Table 3, the logic state at the output terminal is shown in Table 4 below.

TABLE 4

| Ip1 | Ip2 | R1 | R2 | Vout |
|---|---|---|---|---|
| + | + | L | H | High |
| + | − | L | L | Mid |

TABLE 4-continued

| Ip1 | Ip2 | R1 | R2 | Vout |
|---|---|---|---|---|
| − | + | H | H | Mid |
| − | − | H | L | Low |

In Table 4, when the reference voltage for determining logic low and logic high is set between Mid and High, a logic high appears only when both inputs Ip1 and Ip2 are (+). This becomes an AND operation. If the reference voltage is set to a value between Mid and Low, a logic low appears only when both inputs Ip1 and Ip2 are negative. This is an OR operation. That is, the AND operation and the OR operation may be implemented in the same device by a method of setting the level of the reference voltage for determining the logic high and low. That is, in the present invention, four logic operations of NAND, NOR, AND, and OR are implemented in one device by setting the direction of application of an external magnetic field and setting of a reference voltage.

However, in the present embodiment, the resistance of the magnetization inducing unit disposed over the magnetic tunnel junction does not have a significant effect.

PREPARATION EXAMPLE 1

Fabrication and Performance Evaluation of the First Dinned Magnetization Unit

SiO2 is used as the substrate. W (tungsten) is used as the non-magnetic metal layer on the substrate. The thickness of W was not evaluated as it did not affect the performance of the magnetic tunnel junction. In addition, Ta or $W_3Ta$ as the non-magnetic metal layer may be used. A seed layer is formed on the non-magnetic metal layer, and the seed layer is Ta and has a thickness of 5 nm. Due to the seed layer, the common free layer may be grown as a crystal. A common free layer is formed on the seed layer, and CoFeB is formed with a thickness of 1.2 nm to 1.3 nm. MgO is formed to a thickness of 1.15 nm as the common tunnel junction layer. CoFeB is formed to a thickness of 1 nm as a first pinned layer on the common tunnel junction layer.

The material of the first ferromagnetic coupling inducing layer is Ta and has a thickness of 0.35 nm. The first intermediate ferromagnetic layer formed on the first ferromagnetic coupling inducing layer has a structure of $[Co(0.4$ nm$)/Pt(0.3$ nm$)]_6$. That is, a laminated structure of 0.4 nm thick Co and 0.3 nm thick Pt is repeatedly formed as 6 layers. As the first antiferromagnetic coupling inducing layer formed on the first intermediate ferromagnetic layer, Ru is used with a thickness of 0.85 nm. $[Co(0.4$ nm$)/Pt(0.3$ nm$)]_{12}$ is used as the first upper ferromagnetic layer on the first antiferromagnetic coupling inducing layer. That is, a laminated structure of 0.4 nm thick Co and 0.3 nm thick Pt is repeatedly formed as 12 layers. Ta (0.5 nm)/Ru is used as the first read electrode on the first upper ferromagnetic layer.

FIG. 9 is a graph illustrating Vibrating Sample Magnetometer (VSM) data of a first magnetic tunnel junction according to preparation example 1 of the present invention.

Referring to FIG. 9, when an external magnetic field is applied at 4 kOe in the upper direction, the common free layer, the first pinned layer, the first intermediate ferromagnetic layer and the first upper ferromagnetic layer are magnetized in the upper direction.

In FIG. 9, only the magnetization directions of the common free layer, the first pinned layer, the first intermediate ferromagnetic layer, and the first upper ferromagnetic layer are simply illustrated. That is, other functional layers are omitted for convenience of description. Accordingly, the lowermost layer is a common free layer, and the upper part of the common free layer represents the magnetization direction of the first pinned layer, and the first intermediate ferromagnetic layer is on the upper part of the first pinned layer. The uppermost layer shows the magnetization direction of the first upper ferromagnetic layer.

After the external magnetic field has the highest value, if the external magnetic field is gradually decreased, the magnetic moment suddenly drops at about 1.5 kOe. This is because magnetic switching occurs in the first intermediate ferromagnetic layer by antiferromagnetic coupling between the first intermediate ferromagnetic layer and the first upper ferromagnetic layer. In addition, the magnetization of the first pinned layer is directed downward by ferromagnetic coupling with the first intermediate ferromagnetic layer. Since the magnetization direction of the first free layer is determined by the external magnetic field, upward magnetization is maintained.

Subsequently, when the external magnetic field is applied with a negative value of 0 kOe or less and the external magnetic field is directed downward, the first free layer has downward magnetization. The state of magnetization is maintained up to −2 kOe. That is, it can be seen that the external magnetic field applied in the range does not induce a magnetic moment sufficient to overcome the antiferromagnetic coupling.

When the external magnetic field becomes less than −2 kOe, the external magnetic field overcomes the antiferromagnetic coupling and switches the magnetization of all ferromagnetic materials in the downward direction. Therefore, the magnetic moment also has a value of about −1500 μemu.

When the external magnetic field is gradually increased from −4 kOe, the magnetic moment rises to −500 μemu at about −1.5 kOe. This is because the antiferromagnetic coupling overcomes the external magnetic field so that magnetic switching occurs in the upper direction in the first intermediate ferromagnetic layer. The first pinned layer which forms a ferromagnetic coupling also forms upward magnetization according to the magnetic switching of the first intermediate ferromagnetic layer. In addition, the lower first free layer maintains downward magnetization by the downward external magnetic field.

Although an upward magnetic field having a (+) value is applied due to an increase in the external magnetic field, the first upper ferromagnetic layer maintaining the strongest magnetization maintains downward magnetization. However, the first free layer has upward magnetization by an external magnetic field.

When the external magnetic field further increases to reach about 2 kOe, the first upper ferromagnetic layer has upward magnetization due to the strong external magnetic field. In addition, the antiferromagnetic coupling between the first upper ferromagnetic layer and the first intermediate ferromagnetic layer does not affect the magnetization of the ferromagnetic material, and all ferromagnetic layers have upward magnetization.

As described above, the pinned layer may be set to a downward magnetization or upward magnetization state by an external magnetic field.

PREPARATION EXAMPLE 2

Fabrication and Performance Evaluation of the Second Magnetic Tunnel Junction

The composition and thickness of the first magnetic tunnel junction are the same as those shown in Preparation Example 1. In addition, the configuration of the second magnetization inducing unit is the same as the configuration of the first magnetization inducing unit described in Preparation Example 1 above, but the thickness of the second upper ferromagnetic layer is different from the thickness of the first upper ferromagnetic layer. [Co(0.4 nm)/Pt(0.3 nm)]$_3$ is used for the second upper ferromagnetic layer. That is, a laminated structure of 0.4 nm thick Co and 0.3 nm thick Pt is repeatedly formed as three layers. Accordingly, the thickness of the second intermediate ferromagnetic layer is greater than the thickness of the second upper ferromagnetic layer. In addition, Ta(0.5 nm)/Ru is used as the second read electrode on the second upper ferromagnetic layer.

FIG. 10 is a graph illustrating Vibrating Sample Magnetometer (VSM) data of a second magnetic tunnel junction according to a Preparation Example 2 of the present invention.

In FIG. 10, only the magnetization directions of the second free layer, the second pinned layer, the second intermediate ferromagnetic layer and the second upper ferromagnetic layer are disclosed, similar to FIG. 9, and the remaining functional layers are omitted for convenience of description.

Referring to FIG. 10, when 4 kOe of an external magnetic field is applied upward, all ferromagnetic layers constituting the second magnetic tunnel junction and the second magnetization inducing unit have upward magnetization. That is, despite the influence of the antiferromagnetic coupling between the second intermediate ferromagnetic layer and the second upper ferromagnetic layer, all ferromagnetic layers have upward magnetization due to the strong external magnetic field.

When the external magnetic field becomes about 2.8 kOe, only the second upper ferromagnetic layer has downward magnetization due to antiferromagnetic coupling. The magnetic switching of the second upper ferromagnetic layer is due to the antiferromagnetic coupling being stronger than the lower ferromagnetic coupling, and it can be seen from the fact that the thickness of the second upper ferromagnetic layer is greater than the thickness of the second pinned layer.

If the external magnetic field is continuously decreased to be less than 0 kOe, magnetic switching occurs in the second free layer by the external magnetic field. Thus, the second free layer has a downward magnetization.

When the external magnetic field is reduced to about −1 kOe or less, the ferromagnetic coupling, which has a weaker coupling force than that of the antiferromagnetic coupling, is broken, and the magnetization direction of the second pinned layer is determined by the external magnetic field. Thus, the second pinned layer has downward magnetization.

If the external magnetic field continuously increases in the negative direction to a value of −3.2 kOe or less, the strong external magnetic field induces magnetic switching of the second intermediate ferromagnetic layer despite the antiferromagnetic coupling. Accordingly, the second intermediate ferromagnetic layer has downward magnetization, and the second upper ferromagnetic layer also maintains downward magnetization by the external magnetic field. Therefore, all ferromagnetic layers have downward magnetization.

When the external magnetic field gradually increases from −4 kOe and reaches about −2.5 kOe, the strong antiferromagnetic coupling excludes the influence of the external magnetic field to induce magnetic switching of the second upper ferromagnetic layer. Thus, the second upper ferromagnetic layer has upward magnetization, and the other magnetic layers have downward magnetization.

When the external magnetic field further increases to reach about 0.3 kOe, the magnetic moment increases suddenly. This is because the magnetization of the second free layer is switched upward by the external magnetic field.

Then, when the external magnetic field becomes 1 kOe or more, the magnetic moment has a value of 500 μemu. The sharp increase in the magnetic moment is because the magnetization of the second pinned layer participating in the ferromagnetic coupling having a relatively weak coupling force compared to the antiferromagnetic coupling is switched. Accordingly, the second pinned layer and the second free layer have upward magnetization, and the second upward ferromagnetic layer maintains upward magnetization. In addition, since the second intermediate ferromagnetic layer has the largest magnetization, the downward magnetization is maintained despite the external magnetic field.

When the external magnetic field is greater than about 3.3 kOe, all ferromagnetic layers have upward magnetization due to the strong magnetic field.

When a magnetization direction is set by a strong external magnetic field and the external magnetic field is removed in the operation of the second magnetic tunnel junction and the second magnetization inducing unit of FIG. 10, the second pinned layer may be magnetized downward or upward according to the direction of the external magnetic field. In addition, since the hysteresis characteristic appears, it can be seen that the magnetization state of the second pinned layer maintains the predetermined magnetization state even under the influence of an external magnetic field.

According to the present invention described above, one pinned magnetization unit has lower magnetization unit a conventional magnetic tunnel junction structure. However, a magnetization inducing unit capable of changing the magnetization of the pinned layer by an external magnetic field is formed on the magnetic tunnel junction structure. In the magnetization inducing unit, ferromagnetic coupling and antiferromagnetic coupling are achieved using the RKKY interaction. Through this, when an external magnetic field is applied, the magnetization state of the pinned layer of the magnetic tunnel junction structure may be changed. In addition, various logic operations can be implemented by using the current flowing through the non-magnetic metal layer as an input.

The invention claimed is:

1. A logic device comprising:
    a non-magnetic metal layer through which a program current for generating spin orbital torque flows and output voltage is received, and having cross shape;
    a lower magnetic part formed on the non-magnetic metal layer and having perpendicular magnetic anisotropy set by the program current, and being placed in straight line along two opposite ends of four ends of the cross shape; and
    an upper magnetic part formed on the lower magnetic part and having at least two pinned magnetization units that are spaced apart from each other and face each other,
    wherein the lower magnetic part comprises:
        a common free layer formed on the non-magnetic metal layer and having a magnetization direction set by the program current, and
        a common tunnel junction layer formed on the common free layer.

2. The logic device of claim 1, wherein the non-magnetic metal layer having the cross shape comprises:
    a first terminal formed on one end;
    a second terminal opposite the first terminal;
    a third terminal disposed at a position perpendicular to an imaginary line connecting the first terminal and the second terminal; and
    a fourth terminal opposite to the third terminal,
    wherein the lower magnetic part is formed on the first terminal and the second terminal.

3. The logic device of claim 2, wherein the upper magnetic part comprises:
    a first pinned magnetization unit formed on the common tunnel junction layer; and
    a second pinned magnetization unit formed on the common tunnel junction layer and facing the first pinned magnetization unit,
    wherein the first pinned magnetization unit and the second pinned magnetization unit have pinned magnetization states of opposite direction on the cross shape to each other.

4. The logic device of claim 3, further comprising:
    a first electrode formed on the first pinned magnetization unit; and
    a second electrode formed on the second pinned magnetization unit,
    wherein resistance of path composed of the first electrode, the first pinned magnetization unit, the common tunnel junction layer, the common free layer, the common tunnel junction layer, the second pinned magnetization unit and the second electrode is determined by the program current flowing between the first terminal and the second terminal, and the output voltage is received through the fourth terminal.

5. The logic device of claim 3, wherein the first pinned magnetization unit comprises:
    a first pinned layer formed on the common tunnel junction layer; and
    a first magnetization inducing unit formed on the first pinned layer and configured to set magnetization state of the first pinned layer.

6. The logic device of claim 5, wherein the first magnetization inducing unit has antiferromagnetic coupling and ferromagnetic coupling, and changes the magnetization state of the first pinned layer according to external magnetic field.

7. The logic device of claim 5, wherein a magnetic moment due to antiferromagnetic coupling is greater than a magnetic moment due to ferromagnetic coupling.

8. The logic device of claim 5, wherein the first magnetization inducing unit comprises:
    a first ferromagnetic coupling inducing layer formed on the first pinned layer and to induce ferromagnetic coupling according to a Ruderman-Kittel-Kasuya-Yosida RKKY) interaction;
    a first intermediate ferromagnetic layer formed on the first ferromagnetic coupling inducing layer and forming a ferromagnetic coupling with the first pinned layer;
    a first antiferromagnetic coupling inducing layer formed on the first intermediate ferromagnetic layer and for inducing antiferromagnetic coupling according to the RKKY interaction; and
    a first upper ferromagnetic layer formed on the first antiferromagnetic coupling inducing layer, forming an antiferromagnetic coupling with the first intermediate ferromagnetic layer, and having a thickness greater than that of the first intermediate ferromagnetic layer.

9. The logic device of claim 8, wherein a magnetic moment due to antiferromagnetic coupling is greater than a magnetic moment due to ferromagnetic coupling.

10. The logic device of claim 5, wherein the second pinned magnetization unit comprises:

a second pinned layer formed on the common tunnel junction layer; and a second magnetization inducing unit formed on the second pinned layer and configured to set magnetization state of the second pinned layer, wherein a magnetization direction of the second pinned layer is opposite to a magnetization direction of the first pinned layer.

11. The logic device of claim 10, wherein the second pinned magnetization unit comprises:

a second ferromagnetic coupling inducing layer formed on the second pinned layer and to induce ferromagnetic coupling according to a Ruderman-Kittel-Kasuya-Yosida (RKKY) interaction;

a second intermediate ferromagnetic layer formed on the second ferromagnetic coupling inducing layer and forming a ferromagnetic coupling with the first pinned layer;

a second antiferromagnetic coupling inducing layer formed on the second intermediate ferromagnetic layer and to induce antiferromagnetic coupling according to the RKKY interaction; and a second upper ferromagnetic layer formed on the second antiferromagnetic coupling inducing layer and forming an antiferromagnetic coupling with the second intermediate ferromagnetic layer, wherein a magnetic moment due to the ferromagnetic coupling is greater than a magnetic moment due to the antiferromagnetic coupling.

\* \* \* \* \*